United States Patent [19]

Cross

[11] 3,836,905

[45] Sept. 17, 1974

[54] ANALOG TO DIGITAL CONVERTER

[75] Inventor: Charles Cross, Glenside, Pa.

[73] Assignee: Robertshaw Controls Company, Richmond, Va.

[22] Filed: Dec. 12, 1972

[21] Appl. No.: 314,308

[52] U.S. Cl. .......... 340/347 AD, 324/105, 330/143, 340/347 CC

[51] Int. Cl. .......... H03k 13/06

[58] Field of Search ........ 340/347 AD; 324/105, 98, 324/101; 330/143

[56] References Cited

UNITED STATES PATENTS

| | | | |
|---|---|---|---|
| 3,495,235 | 2/1970 | Ottesen | 340/347 AD |
| 3,509,560 | 4/1970 | Bowers et al. | 340/347 AD |
| 3,550,114 | 12/1970 | Cole | 340/347 AD |
| 3,585,633 | 6/1971 | Young | 340/347 AD |
| 3,634,856 | 1/1972 | Karlsson | 340/347 AD |

OTHER PUBLICATIONS

Hoeschele, "A–D – Conversion Techniques," Wiley & Sons, 8/1968 pages 99–106.

Hoeschele, "A–D – Conversion Techniques," Wiley & Sons, 8/1968 pages 359–361.

*Primary Examiner*—Thomas J. Sloyan
*Attorney, Agent, or Firm*—Anthony A. O'Brien

[57] ABSTRACT

An analog to digital converter is disclosed having control and comparator portions. The control portion is formed by a number of J-K flip flops arranged to sequentially receive on their J inputs the decoded output of a binary counter. The flip flops in turn control by their Q outputs a number of analog switches in the comparator portion. The switches are connected to feed a reference voltage to a ladder network and obtain a voltage for comparison with a multiplexed analog voltage in a comparator. The output of the comparator controls the setting and resetting of the flip flops with their final set giving the binary analog to digital output.

2 Claims, 5 Drawing Figures

ANALOG TO DIGITAL CONVERTER

BACKGROUND OF THE INVENTION

1. Field of the Invention

The present invention relates to an analog to digital converter having fewer components than substantially the same but which achieves speed as a conventional successive approximation converter.

2. Description of the Prior Art:

Whenever an analog voltage is required in digital form, an analog to digital converter must be employed. Over the years many varieties of converters have been designed, all of which fall into two main categories: direct, in which the unknown voltage is compared directly with a reference voltage, and indirect, in which there is an intervening step prior to a determination of the digital output.

All analog to digital converters inherently have a multiplicity of errors and it is the minimization of these errors which is one of the greatest problems in converter design. While it may be possible to make almost any converter operate with the desired accuracy at a fixed temperature and at a particular instant, the converter is worthless if it cannot maintain this accuracy over normal operating temperatures and for a reasonable period of time. Some of the errors encountered include:

Reference accuracy and stability;
Comparator accuracy and gain;
Time-dependent errors;
Resistor accuracy and stability;
Offset errors;
Power supply variations; and
Switching component variations.

Depending on the type of analog to digital converters, there may be as many as thirty sources of error. Fortunately, the probability of all such errors adding in the same direction is very remote. However, it is also unrealistic to use the root mean square value of the errors since there is not a sufficient number for them to be considered random. A realistic value for the error is about one quarter to one third of the worst error. Accurate determination of all the major error sources must be made a part of the analog to digital converter design. A converter which is basically sound circuit wise may fail miserably if this is not done.

One of the most significant causes of error in an analog to digital converter is the stability of the reference voltage with temperature and time. The cost of a voltage source having a low temperature coefficient is considerable and even then it must be periodically recalibrated because of long term drift. If care is not used in the selection of the reference source, temperature and long term drifts can easily exceed the value of one bit of the conversion.

SUMMARY OF THE PRESENT INVENTION

The present analog to digital converter is characterized by a binary counter and decoder having a plurality of outputs, a J–K flip flop connected to each output and a plurality of analog switches connected to be selectively enabled by the J–K flip flops. A ladder network is connected between a reference voltage and comparator means and is controlled by the analog switches. The comparator receives and compares an analog voltage with the known ladder network output to give a comparator output used to control setting and resetting of the J-K flip flops with the final setting thereof giving the binary output of the converter.

It is also an object of the present invention to construct an analog to digital converter which will have almost the same speed as a successive approximation converter but which requires considerably fewer components.

It is a further object of the present invention to construct an analog to digital converter which provides the desired accuracy and reliability while being economical to build and operate.

It is also an object of the present invention to construct an analog to digital converter having means to prevent variations in a reference voltage from substantially affecting the accuracy of the output of the converter.

It is yet another object of the present invention to construct an analog to digital converter which employs J-K flip flops, equal in number to the bits to be converted, for enabling analog switches connected to an R-2R ladder network, the output of which forms one input to a comparator having a multiplexed analog second input and which sends a comparison signal to set or reset the flip flops.

The means for accomplishing the foregoing objects and other advantages will become apparent from the following description of a preferred embodiment taken in connection with the accompanying drawings.

DESCRIPTION OF THE PREFERRED EMBODIMENT

Figure 1:
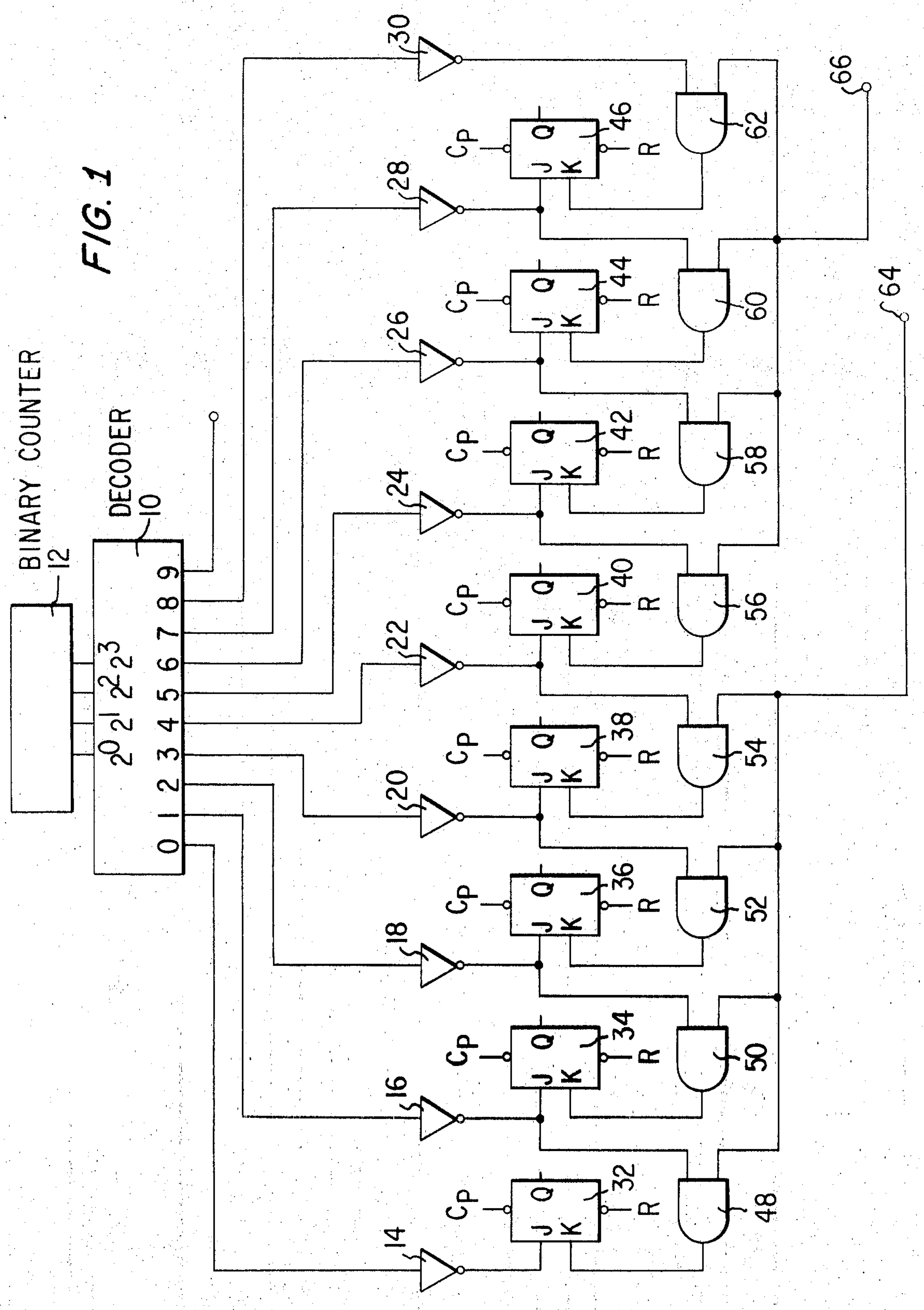
FIG. 1 is a schematic diagram of a control circuit portion of an eight binary bit analog to digital converter according to the present invention.

The control circuit portion of the present eight bit binary analog to digital converter, see FIG. 1, includes a decoder 10 connected to receive four binary inputs from binary counter 12. The outputs of the decoder are connected in parallel to inverters 14, 16, 18, 20, 22, 24, 26, 28 and 30. The outputs of inverters 14, 16, 18, 20, 22, 24, 26 and 28 are connected to the J inputs of J-K flip flops 32, 34, 36, 38, 40, 42, and 46, respectively. The outputs of inverters 16, 18, 20, 22, 24, 26, 28 and 30 are connected as one input to each of AND gates 48, 50, 52, 54, 56, 60 and 62, the outputs of which are connected to the K inputs of flip flops 32, 34, 36, 38, 40, 42, 44 and 46, respectively. The second inputs to AND gates 48, 50, 52, and 54 are connected to terminal 64 while the second inputs to AND gates 56, 58, 60 and 62 are connected to terminal 66. Each of the J–K flip flops is connected by their terminals Cp to a clock pulse source (not shown) and by their terminals R to a reset pulse source (also not shown). The Q outputs of flip flops 32, 34, 36, 38, 40, 42, 44 and 46 are connected to terminals 68, 70, 72, 76, 78, 80 and 82, respectively (see FIG. 2) of the comparator portion of the present converter.

Figures 2, 3:
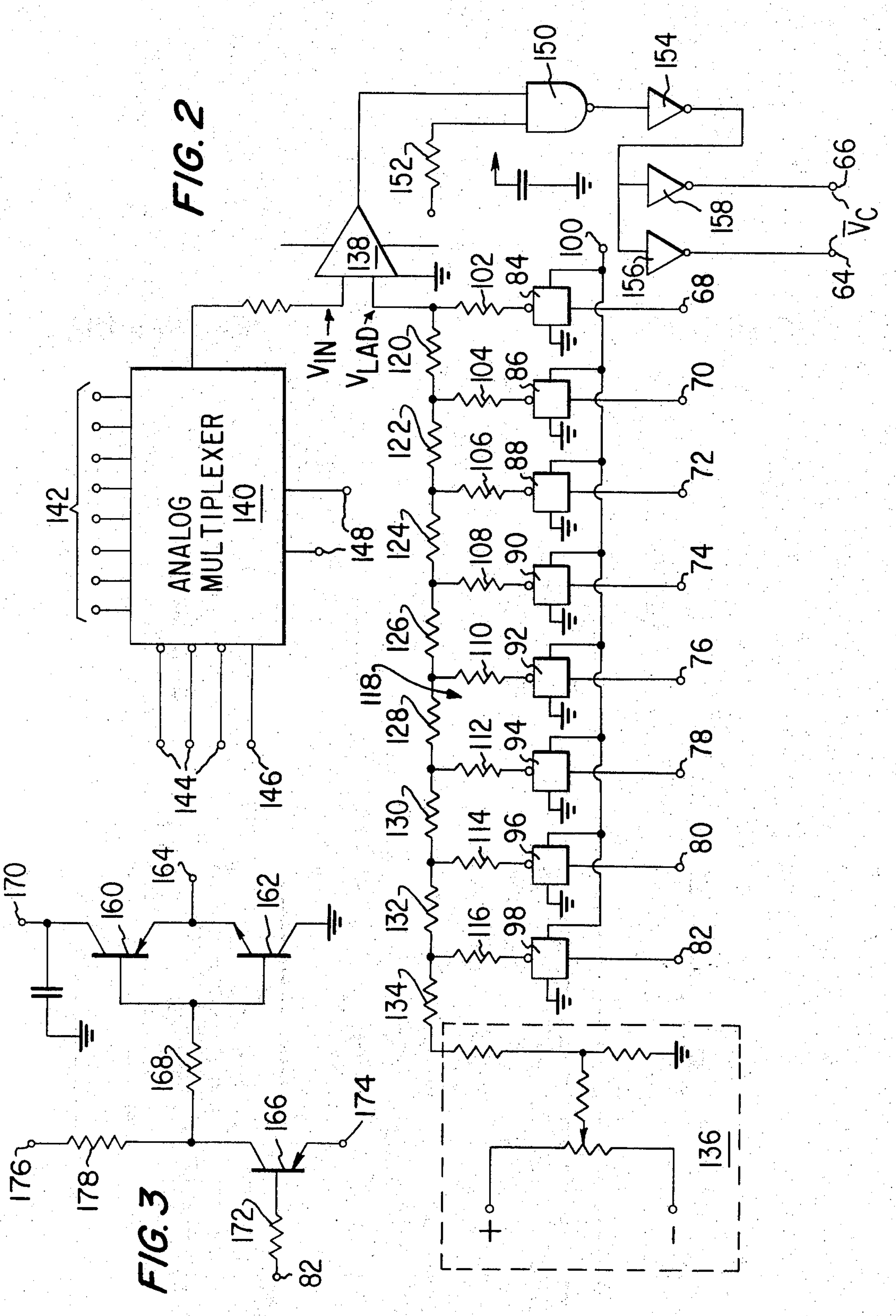
FIG. 2 is a schematic diagram of a comparator, ladder network and analog multiplexer portion of an eight binary bit analog to digital converter according to the present invention.
FIG. 3 is a schematic diagram of one of the analog switches shown in FIG. 2.

The comparator portion of the present analog to digital converter, FIG. 2 has a series of analog switches 84, 86, 88, 90, 92, 94, 96 and 98 which are connected between a reference voltage at terminal 100 and ground, and between terminals 68, 70, 72, 74, 76, 78, 80 and 82, respectively, and resistors 102, 104, 106, 108, 110, 112, 114 and 116 of R–2R ladder network 118. Resistors 120, 122, 124, 126, 128, 130, 132 and 134 complete the ladder network with resistor 134 being connected to an adjustable reference voltage circuit 136.

The output of the ladder network 118 is connected as one input to comparator 138. The other input to comparator 138 is connected to analog multiplexer 140 having analog inputs to terminals 142, binary inputs to terminals 144, an enable input to terminal 146, and voltage inputs to terminals 148. The output of the comparator 138 is connected as one input of NAND gate 150, the other input of which is tied to a reference voltage through resistor 152. The output of NAND gate 150 is connected through inverter 154 to parallel connected inverters 156 and 158 which are connected to terminals 64 and 66, respectively, of the control circuit, see FIG. 1.

All of the analog switches are identical. For the sake of illustration, the least significant bit analog switch 98 is shown in FIG. 3. A pair of emitter and base coupled transistors 160, 162 have their emitters connected to resistor 116 of the ladder network by terminal 164 and their bases to the collector of transistor 166 through resistor 168. The collector of transistor 160 is connected at a terminal 170 to the reference voltage at terminal 100 and the collector of transistor 162 is connected to ground. Transistor 166 has its base connected to the logic terminal 82 through resistor 172, its emitter coupled to a positive voltage at terminal 174 and its collector coupled to a negative voltage at terminal 176 through resistor 178.

Figure 4:
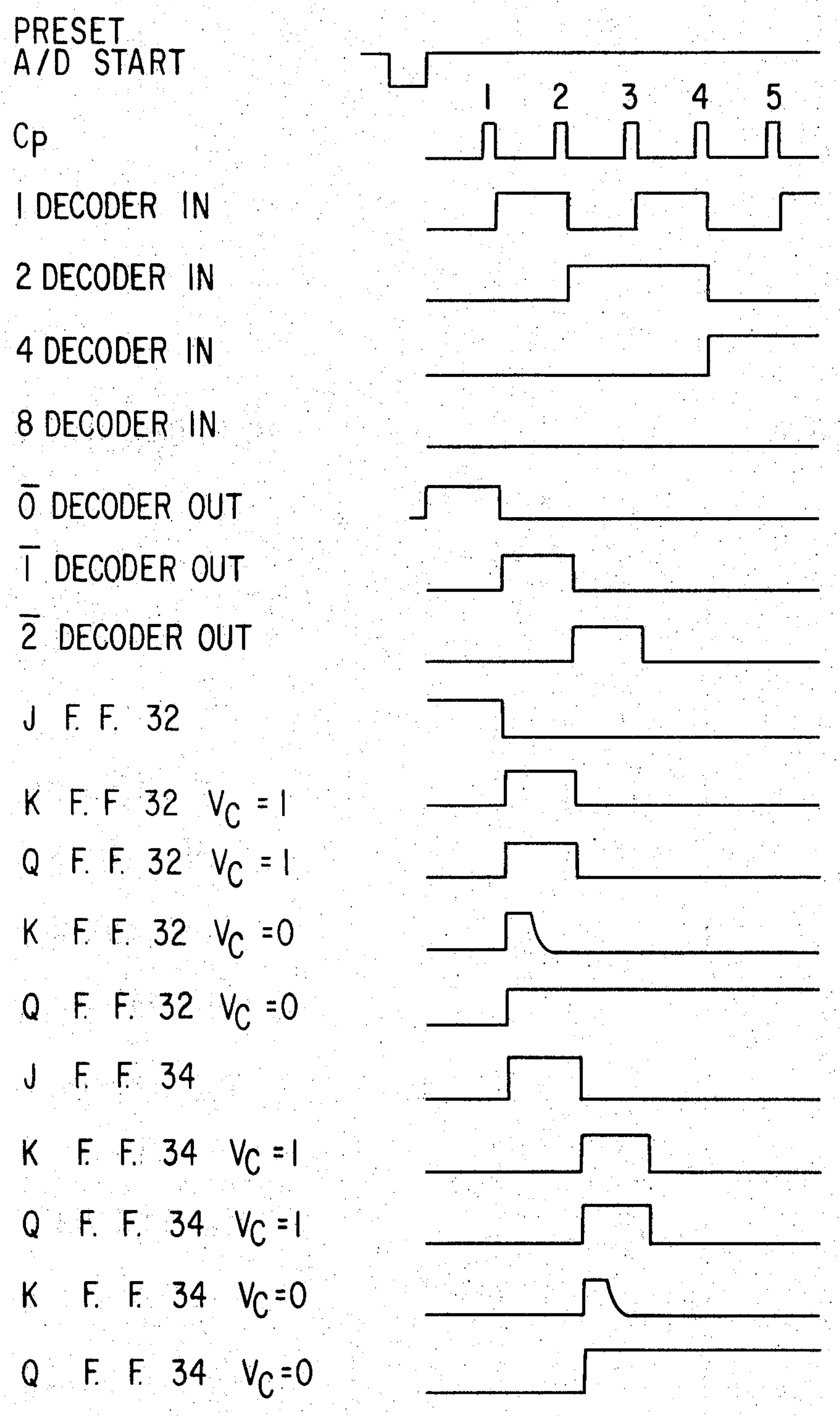
FIG. 4 is a timing chart for the present invention.

The analog to digital converter operates in the following manner, with reference to FIGS. 1, 2, and 4. All flip-flops 32, 34, 36, 38, 40, 42, 44 and 46 are initially reset as is the sequencing counter 12 which causes all of the inputs to the decoder 10 to be 0. The 0 output of the decoder 10 is 0 while all other decoder outputs are 1. The decoder outputs are inverted by inverters 14, 16, 18, 20, 22, 24, 26 and 28 so that at this time, there will be a 1 at the J input of flip flop 32 and a 0 at the J input of the other flip flops. Since the inputs to AND gates 48, 50, 52, 54, 56, 58, 60 and 62 are 0, the K inputs of all the flip flops will also be 0.

On the rising edge of the first clock pulse Cpl the J–K inputs of flip flop 32 are transferred into the master section. Since all the other flip flops have 0 on both their J and K inputs they do not change.

On the falling edge of the first clock pulse Cpl there is a transfer to the slave section and the Q output of the flip flop 32 becomes 1. The counter 12 outputs advance one count to 0001. The decoder output 1 becomes 0 and all other decoder outputs are 1. The J input to flip flop 34 is now 1 while the J inputs to the other flip flops are 0.

The Q output of flip flop 32 connected to terminal 68 turns on the most significant bit analog switch 84 which in turn connects reference voltage Vr from terminal

100 to the most significant bit leg of the ladder network 118 formed by resistors 102 and 120. All of the other ladder analog switches have their respective legs connected to ground. The output of the ladder network Vlad is ½ Vr, which is equal to the full range of the analog to digital converter. If Vin from multiplexer 142 is greater than Vlad, then $\overline{V}$c at the output of comparator inverters 156 and 158 will be 0. If Vin is less than Vlad, then $\overline{V}$c at the output of inverters 156 and 158 will be 1. If Vc = 0 (Vin > Vlad) the output of gate 48 is 0 the K input to flip flop 32 is 0 as is the J input. Since Vin is greater than Ylad the input voltage is greater than ½ Vr and the most significant bit analog switch 84 must be kept on. When the J and K inputs to a J– K flip flop are both 0 a clock pulse will not cause any change in its output.

On the rising edge of Cp2 there is no change in flip flop 32 and the inputs to flip flop 34 are transferred in. The other flip flops do not change since they have 0 on both their J and K inputs.

On the falling edge of Cp2 the counter outputs advance one count to 0010 and the decoder output 2 becomes 0 while the other outputs are 1. The Q output of flip flop 32 remains 1 and the Q output of flip flop 34 becomes 1. The J input of flip flop 36 becomes 1 and the J inputs of the remaining flip flops are 0. Analog switch 86 connects the next most significant bit leg of the ladder to reference voltage Vr and analog switch 84 remains 0.

If Vc = 1 (Vin < Vlad) the output of gate 48 is 1 the K input to flip flop 32 is 1 and the J input is 0. Since Vin is less than Vlad, the input voltage is less than ½ Vr and the most significant bit analog switch 84 must be turned off. When the J and K inputs are as above described and a clock pulse is received, the Q output of the flip flop will become 0 thereby turning off the analog switch 84.

For this condition, on the rising edge of Cp2 the J and K inputs of flip flop 32 are transferred in as are the inputs to flip flop 34. The other flip flops do not change since they have 0 on both their J and K inputs.

On the falling edge of Cp2 the counter outputs advance one count to 0010, the decoder output 2 becomes 0 and the remaining outputs 1, the Q output of flip flop 32 changes to 0 so that analog switch 84 is turned off and the most significant bit leg of the ladder is connected to ground. The Q output of flip flop 34 changes to 1. The J input to flip flop 36 becomes 1 while the J inputs to the other flip flops are 0. Analog switch 86 is turned on to connect reference voltage Vr to that ladder leg.

Each bit is sequenced in exactly the same manner as above described. After the last bit check the converter is inhibited to prevent further change and the Q outputs of the flip flops give the binary analog to digital output.

In summary, the leading edge of each clock pulse Cp samples the $\overline{V}$c and the falling edge causes the flip flops to either complement or remain the same depending on $\overline{V}$c. A 1 on the K input of any flip flop will cause it to complement and a 0 on the K input will cause the flip flop to hold. The next successive flip flop will be set on the falling edge of each subsequent clock pulse.

It should be noted that the present analog to digital converter has been shown using eight bits only as an example and that the subject decoder could be expanded to handle any number of bits. The decoder 10, for example, could be replaced by a shift register for this expanded decoding.

The analog switches may be selected from one of the three presently known switches which include: 1. bipolar 2. Field effect transistor (FET) and 3. Metal oxide semiconducter field effect transistor (MOS FET). The bipolar switches, see FIG. 3, are formed by NPN or PNP transistors which have been selected for their low on resistance. They are usually connected in an inverted fashion meaning that the excess base current which flows through the collector (i.e., the current necessary to just cause saturation of the transistor) may flow through the emitter, but any base current above this amount must flow through the collector. The inverted mode of transistor operation has a very important application in analog switching, since the voltage offset (the voltage between the collector and emitter with no emitter current flowing) is reduced by almost an order of magnitude. Therefore, if the offset voltage is 2 MV with the normal connection, it is 0.2 or 0.3 MV inverted. Since the voltage offset causes an error when the switch is used in an analog to digital converter it is most desirable to use the inverted mode for this application.

The R–2R ladder network is so named because only two values of resistors are used. Each successive switch closure results in half the preceding voltage. The voltage output is directly proportional to the switch or switches that are closed. Thus for the eight bit binary ladder shown the weights of the bits are 1, 2, 4, 8, 16, 32, 64 and 128. For example, when the 8 bit switch 90 is closed, there is eight times greater output than when the 1 bit switch 84 is closed. A binary number sequencer also changes by a factor of two for each number. Therefore this circuit is known as a binary R–2R network.

Figure 5:
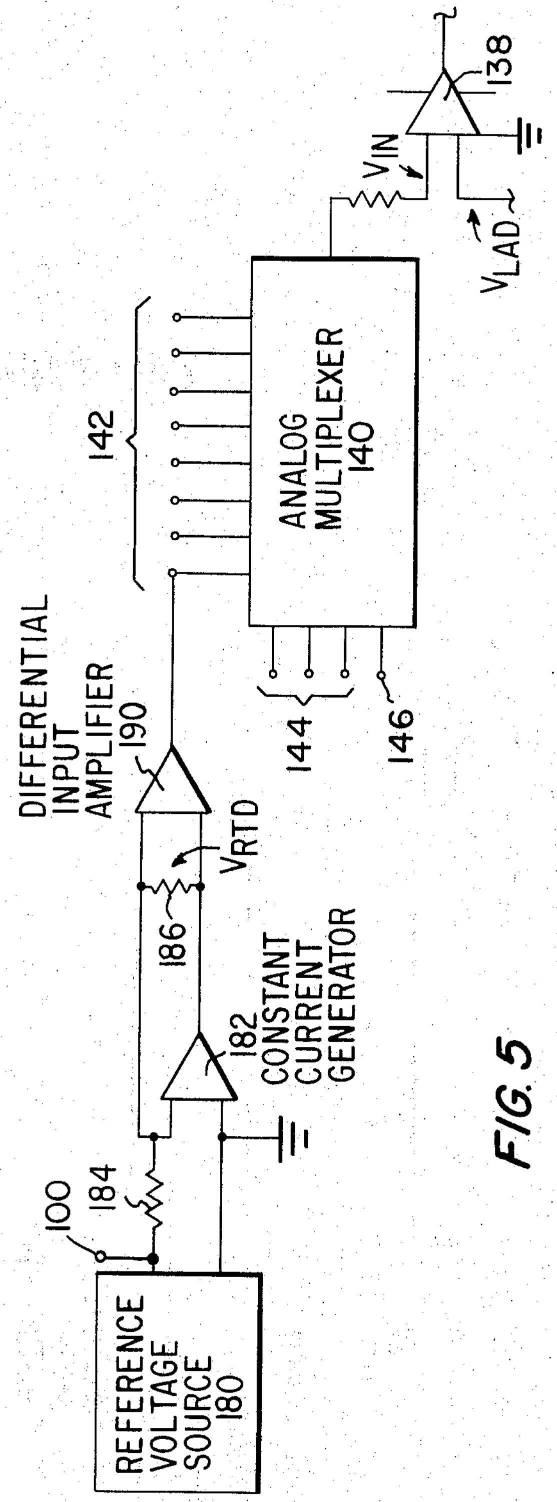
FIG. 5 is a schematic illustrating analog to the multiplexer of FIG. 2.

The analog inputs from field points are normally obtained with Wheatstone bridge circuits; however, an alternate embodiment is shown in FIG. 5 which prevents any variation in the reference voltage Vr from substantially affecting the accuracy of the output from the comparator. In this embodiment reference voltage source 180, which also supplies the voltage at terminal 100, is connected to a constant current generator 182 through resistor 184. The output from generator 182 is fed through the analog field point, such as a temperature sensor 186, and to differential input amplifier 190 which is connected to one input 142 of analog multiplexer 140.

Since the same reference voltage source is being used to supply Vr at terminal 100 and as the source for the constant current generator 182, any change in the reference voltage will cause a directly proportional change to the Vin to the comparator 138. For example, if Vr increases, the current output from the constant current generator 182 will increase in direct proportion as will the voltage across the sensor 186, the output of the differential amplifier 190 and the input Vin to the comparator 138. Since both the voltages Vr and Vin increase in direct proportion, the change does not affect the output obtained from the converter so that this source of error, namely, reference voltage variations, is eliminated. Furthermore, the use of the constant current generator 182 renders the circuitry independent of the distance between the remote analog field point and a panel housing the analog to digital converter since the current is constant regardless of the length of the connecting wires.

This embodiment is shown with a resistance temperature sensor but would be suitable for use with other resistance type sensors and potentiometers such as those used for pressure sensing, set-point, etc.

Inasmuch as the present invention is subject to a variety of modifications and changes in details, it is intended that all matter contained in the above description and as shown in the accompanying drawings shall be interpeted as illustrative and not in a limiting sense.

What is claimed is:

1. A high speed successive approximation analog to digital converter comprising:

binary counter and decoder means having a plurality of outputs;

a plurality of J-K flip flops equal to the number of outputs from said decoder means, each of said flip flops having a first input connected with one of said outputs from said decoder means, a second input, a clock input and an output, clock means for supplying clock pulses to said clock inputs of said flip flops, said clock pulses having leading and trailing edges;

a plurality of analog switches connected to be enabled by respective ones of said outputs of said flip flops;

a ladder network selectively connected to a reference voltage by said analog switches to provide known outputs;

comparator means adapted to receive and compare an analog voltage with said known outputs from said ladder network and provide a comparator output;

gating means receiving said comparator output and said outputs from said decoder means for supplying outputs to said second inputs of said flip flops to control the states thereof, said flip flops being responsive to said leading edge of each of said clock pulses to sample said outputs from said gating means and said decoder means and being responsive to said trailing edge of each of said clock pulses to trigger said flip flops whereby the final states of said flip flops provides a binary output corresponding to the analog voltage;

variable resistance sensor means;

current generating means for supplying a constant current through said sensor means;

amplifier means connected across said sensor means for supplying said analog voltage to said comparator means in accordance with the varying resistance of said sensor means; and a reference voltage source supplying said reference voltage to said ladder network and supplying an operating voltage to said current generating means whereby variations' in said reference voltage will be proportional to variations in said analog voltage.

2. A high speed successive approximation analog to digital converter according to claim 1 wherein each of said analog switches normally connects an associated leg of said ladder network to ground, and each of said analog switches is connected to be enabled by said output of one of said flip flops to connect said reference voltage to said ladder leg.

* * * * *